United States Patent
May

(10) Patent No.: US 9,766,271 B2
(45) Date of Patent: Sep. 19, 2017

(54) TRANSFORMER-RATED ELECTRICAL METER ARRANGEMENT WITH ISOLATED ELECTRICAL METER POWER SUPPLY

(71) Applicant: TSTM, Inc., Sioux Falls, SD (US)

(72) Inventor: Greg May, Sioux Falls, SD (US)

(73) Assignee: TSTM, Inc., Sioux Falls, SD (US)

( * ) Notice: Subject to any disclaimer, the term of this patent is extended or adjusted under 35 U.S.C. 154(b) by 464 days.

(21) Appl. No.: 14/246,990

(22) Filed: Apr. 7, 2014

(65) Prior Publication Data

US 2015/0288175 A1    Oct. 8, 2015

(51) Int. Cl.
  *G01R 1/36* (2006.01)
  *G01R 11/02* (2006.01)
  *G01R 22/06* (2006.01)

(52) U.S. Cl.
  CPC ............... *G01R 1/36* (2013.01); *G01R 11/02* (2013.01); *G01R 22/061* (2013.01)

(58) Field of Classification Search
  CPC . H02H 9/008; G01R 1/04; G01R 1/36; G01R 22/061; G01R 11/02
  USPC ......................................................... 361/52
  See application file for complete search history.

(56) References Cited

U.S. PATENT DOCUMENTS

| | | | |
|---|---|---|---|
| 4,737,903 A | 4/1988 | Nishikawa et al. | |
| 5,087,875 A | 2/1992 | Balch et al. | |
| 6,112,158 A * | 8/2000 | Bond | G01R 21/1333 324/107 |
| 6,289,267 B1 * | 9/2001 | Alexander | H02H 3/00 700/286 |
| 6,538,577 B1 | 3/2003 | Ehrke et al. | |
| 6,998,043 B2 * | 2/2006 | Fischer | B01D 35/0273 210/232 |
| 7,064,679 B2 | 6/2006 | Ehrke et al. | |
| 7,277,027 B2 | 10/2007 | Ehrke et al. | |
| 7,359,221 B2 | 4/2008 | Knill | |
| 7,583,202 B2 | 9/2009 | Robinson et al. | |
| 7,772,989 B2 | 8/2010 | Ehrke et al. | |
| 8,023,235 B2 | 9/2011 | Bilac et al. | |
| 8,537,028 B2 | 9/2013 | Ehrke et al. | |
| 2002/0128035 A1 | 9/2002 | Jokinen et al. | |
| 2010/0318306 A1 | 12/2010 | Tierney et al. | |
| 2012/0026007 A1 | 2/2012 | Beattie | |
| 2012/0264385 A1 | 10/2012 | Oh et al. | |
| 2015/0285844 A1 | 10/2015 | May | |
| 2016/0012953 A1 | 1/2016 | May | |

FOREIGN PATENT DOCUMENTS

| WO | WO 87/07105 A1 | 11/1987 |
|---|---|---|
| WO | WO 2010/130258 A1 | 11/2010 |

* cited by examiner

*Primary Examiner* — Melissa Koval
*Assistant Examiner* — Courtney McDonnough
(74) *Attorney, Agent, or Firm* — Merchant & Gould P.C.

(57) ABSTRACT

An electrical circuit protecting an electrical utility meter used in connection with an electrical supply connection having a plurality of phases is disclosed. The circuit includes a plurality of voltage transformers, each of the plurality of voltage transformers electrically connected between one of the plurality of phases of the electrical supply connection and an input power connection of an electrical meter, and an electrical connection of the electrical meter dedicated to a power supply of the electrical meter.

21 Claims, 11 Drawing Sheets

TRANSFORMER-RATED ELECTRICAL METER ARRANGEMENT WITH ISOLATED ELECTRICAL METER POWER SUPPLY

TECHNICAL FIELD

The present disclosure relates generally to electrical meter circuitry, and in particular to a transformer-rated electrical meter arrangement with an isolated electrical meter power supply.

BACKGROUND

Electrical meters have long been used to measure energy consumption at a premises of a utility service consumer. Such meters are available in many forms, and have changed significantly over time. Traditional electrical meters were typically implemented as induction meters, which included pot coils that measure a voltage of a circuit to be metered, as well as current coils in series with the service to be monitored. Such coils could in turn induce movement of disks which are calibrated to rotate at a rate based on observed voltage, current and their phase relationship. Dials calibrated using such disk rotations could then be periodically monitored by a utility to determine consumption by the customer. Hence, by monitoring the voltage, current and their phase relationship delivered to a consumer, overall energy consumption and power could be determined.

Electrical service that is delivered to a consumer premises, and in particular to a commercial location, may have a current delivery capability as high as 5000 amps. Such service is not typically capable of being handled by a meter. As such, this electrical service was traditionally stepped down using instrument transformers to signal levels manageable by a meter.

Electrical meters as are discussed above were traditionally electromechanical, in that the voltage and current phase relationship generate magnetic fields proportional to the wattage, which acts on an aluminum disk within the meter that moves (typically rotates) proportionally to real power delivered to the premises.

More recently, most of the electromechanical meters as discussed above have been transitioned (at least for new installations) to meters including solid state measurement elements, which are capable of operating across wide voltage ranges. However, such meters were designed to be backwards compatible with prior metering technologies to allow them to be installed directly in place of traditional meters. As such, these solid state meters also accommodate a 20 amp current transformer output and up to 480 volts for voltage circuits. This is the case even though the electrical burden of such solid state devices is substantially lower than that of the prior electromechanical meters.

Recent solid-state meters typically come in one of two forms. First, transformer-rated meters, as seen by way of example in FIG. 1, typically used in larger business or industrial applications, are configured such that voltages and currents received from a power line transformer 12 (e.g., connected to a power line 11) are electrically connected to different terminals on the electrical interface of a meter 20. Transformer-rated meters 20 can be electrically connected to a power line transformer 12 by one or more voltage transformers 14 (shown as transformers 14a-c, in each of three phases of a power supply). In particular, transformer-rated meters 20 include voltage measurement elements 24 and current measurement elements 26, respectively, connecting the meter 20 to supply lines at voltage transformers 14a-c, and current transformers 16a-c, respectively. A power supply 22 is electrically connected to one of the phases of the power supply, for example the "A" phase as shown in FIG. 1.

Second, self-contained electrical meters 120 (as seen in FIG. 2), typically used in small business applications, are configured such that voltage and current measurement elements 24, 26, respectively, are electrically connected to the same terminals of an electrical interface to the meter. Such meters allow load currents to flow through the meter to a customer facility 18, such that all power delivered to a customer premises passes through the meter. By way of comparison, transformer rated meters are able to be connected to higher voltage and current level services via current transformers and possibly voltage transformers, as they can be connected to service delivered to a customer premises. Both types of meters are designed for connection to multi-phase electrical service connections.

Irrespective of the type of meter used, an electrical meter typically includes a voltage measurement element 24 (an associated current measurement elements 26) associated with two or more of the phases of an electrical service connection (e.g., depending on the type of connection used) and a power supply 22 electrically connected to a phase of the electrical service and used to power the meter and any communication equipment included in the meter. The voltage measurement elements associated with each phase require a reliable, stable electrical connection to reliably detect voltage delivered to the premises (and therefore accurately track energy consumption); as such, other electrical connections within the meter cannot have a significant impact on the input voltage measured at the voltage measurement elements.

In many cases, a power supply 22 included in an electrical meter is a switching power supply designed to operate at a variety of different input voltages, and as such creates non-linear loads. Such loads, as affected by the power supply, can distort a non-"stiff" waveform. In other words, if the input voltage (in particular, the phase to which the power supply is connected) to a meter is susceptible to distortion, it is likely to be distorted by the power supply.

To avoid distortion of an input voltage, a traditional approach for transformer-rated meters has involved use of large-scale transformers, shown as voltage transformers 14a-c in the case of a transformer-rated meter 20, on each of the phases that are input to the meter. These transformers 14a-c provide the "stiff" signal connection for a meter 20, which is otherwise provided in the case of the self-contained meter by the signal received from the power line transformer 12.

Because the burden on each transformer in a transformer-rated meter includes the voltage measurement element (which has a burden of a less than one VA), and on one phase additionally includes a switching power supply (as seen in FIG. 1), voltage transformers are used that have a very high burden rating, such as a 500 VA transformer with an accuracy burden rating of 35 VA. This is required in such systems because it prevents distortion of the input voltage to the voltage measurement element on the phase to which the power supply is connected.

Use of such rated transformers on each phase of an input connection to a meter has drawbacks. For example, such transformers can be heavy and large, and may be difficult to install. In some cases, each transformer can weigh up to about 12-30 pounds. Additionally, such transformers can be expensive when installed on multiple phases of an electrical service, often eclipsing the cost of the meter when considering both the cost of each of the transformers and the cost of installation.

To avoid such costs, some electrical utilities have opted to instead not install protective voltage transformers, but rather allow input to the meter to be directly from an electrical service in the case of both self-contained and transformer-rated meters. Such installations require service personnel to wear protective clothing due to the high voltages and currents involved, and the high risk of arcing that can cause substantial burns or other serious injuries. As such, in even these cases, maintenance costs are high due to the time required for service personnel to put on or take off such protective gear, and also a risk of serious injury is elevated.

For these and other reasons, improvements are desirable.

SUMMARY

In accordance with the following disclosure, the above and other issues are addressed by the following:

In a first aspect, an electrical circuit protecting an electrical utility meter used in connection with an electrical supply connection having a plurality of phases is disclosed. The circuit includes a plurality of voltage transformers, each of the plurality of voltage transformers electrically connected between one of the plurality of phases of the electrical supply connection and an input power connection of an electrical meter, and an electrical connection of the electrical meter dedicated to a power supply of the electrical meter.

In a second aspect, an electrical meter arrangement installed at a location associated with an electrical service customer is disclosed. The arrangement includes an electrical meter monitoring power consumption of the electrical service customer, the electrical meter including a plurality of input power connections and having a plurality of voltage measurement elements configured to measure a voltage at a plurality of different phases of an electrical service. The arrangement further includes a plurality of voltage transformers, each of the plurality of voltage transformers electrically connected between one of a plurality of phases of the electrical supply connection and a corresponding voltage measurement element, and an electrical connection of the electrical meter dedicated to a power supply of the electrical meter.

In a third aspect, a method of managing electrical connections to an electrical meter associated with delivery of an electrical service to a customer premises by a user includes electrically connecting a signal transformer to one of the plurality of phases of the electrical service, and electrically connecting the signal transformer to a power supply of the electrical meter in the absence of connecting the signal transformer between a voltage transformer of the plurality of voltage transformers and the corresponding voltage measurement element.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

DETAILED DESCRIPTION

Generally speaking, the present disclosure relates to electrical meters, and in particular improvements to such meters and circuitry used in association with such meters to provide improved safety, as well as lowered installation costs in connection with electrical metering applications. Generally, the methods and systems of the present disclosure relate to connection of circuitry, and in particular connection of a particular transformer arrangement either as part of an electrical meter or protecting an electrical meter from high power line currents/voltages. In some such embodiments, connection of a separate transformer between an electrical service and a power supply of an electrical meter allows for use of a lower-tolerance transformer, e.g., a transformer with a lower rating, for each phase of an electrical service that is connected to a voltage measurement element of a meter. Because the power supply is connected to a phase of the electrical service via a different transformer, the existing transformers used, which are external transformers in the case of a transformer-rated meter, can have lower burden ratings and therefore be substantially smaller in size and lower in cost. Furthermore, in both cases of a transformer rated meter and a self-contained meter, isolation of the power supply from the supplied phases of the electrical service improves reliability of the meter, preventing failures. Furthermore, because the transformer connected to the power supply does not have the close tolerance requirements of transformers connected to voltage measurement elements of a meter (since the signal output from such a transformer does not affect metrology), that transformer can have a lower VA rating and lower tolerance (since a signal transformer need not comply with ANSI standards for voltage transformers). As such, that transformer can also be smaller and, consequently, lower cost.

Overall, this results in an additional transformer, but lower cost for a circuit or meter including that additional transformer. Such lower costs encourage electrical utilities to provide such transformer protections, which lowers maintenance costs and improves safety. Because such transformers are present, the risk of electrical shock is substantially lowered, improving safety. Furthermore, because maintenance personnel are not required to wear additional protective clothing or equipment when servicing such meters, time lost putting on/taking off such protective clothing/equipment, as well as the cost of the clothing itself, are avoided. Furthermore, by isolating the power supply from the electricity supply phases, meter reliability is greatly enhanced, with far fewer meter failures occurring in both self-contained and transformer-rated meter arrangements.

Figure 1:
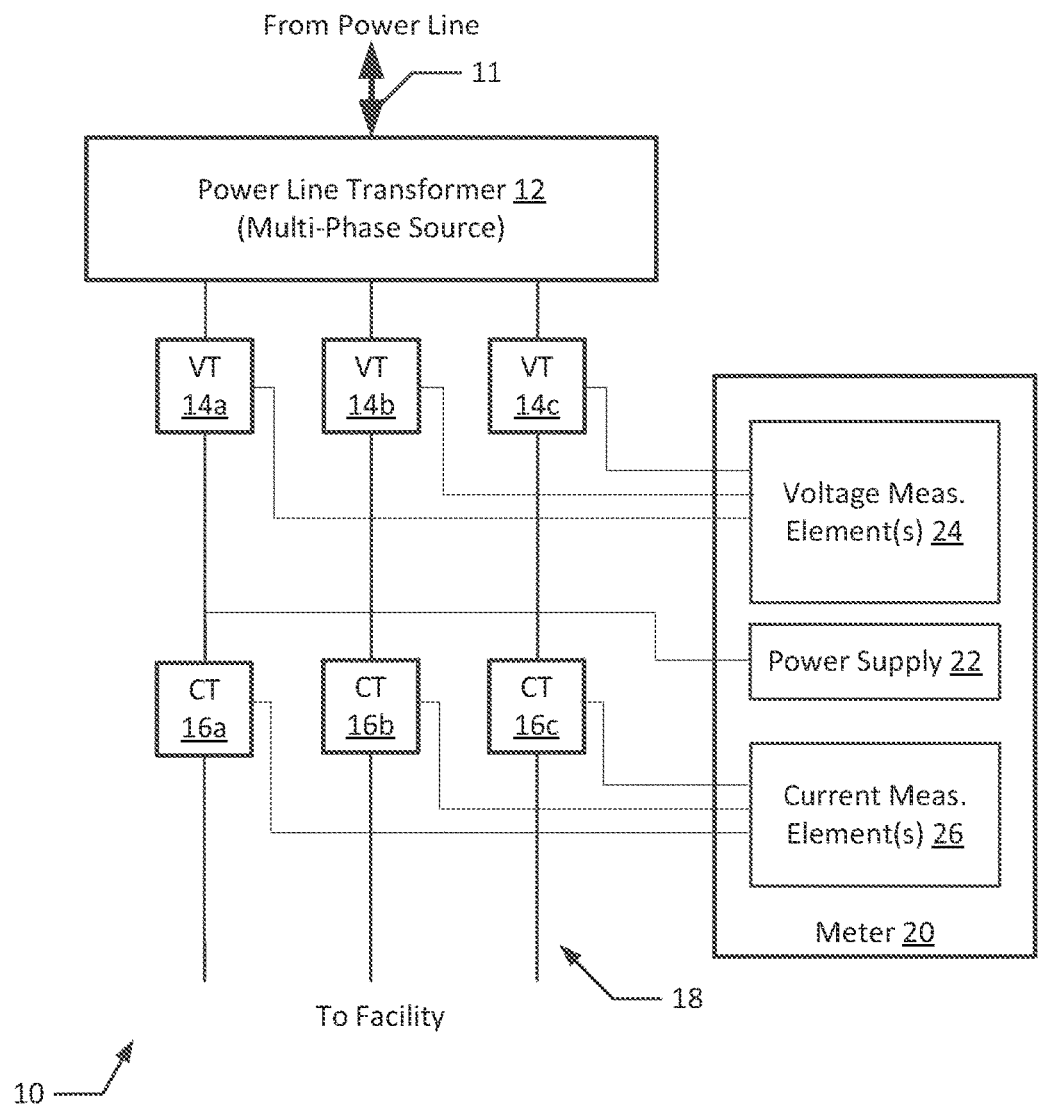
FIG. 1 illustrates an existing transformer-rated meter arrangement installable at a customer premises.
Figure 3:
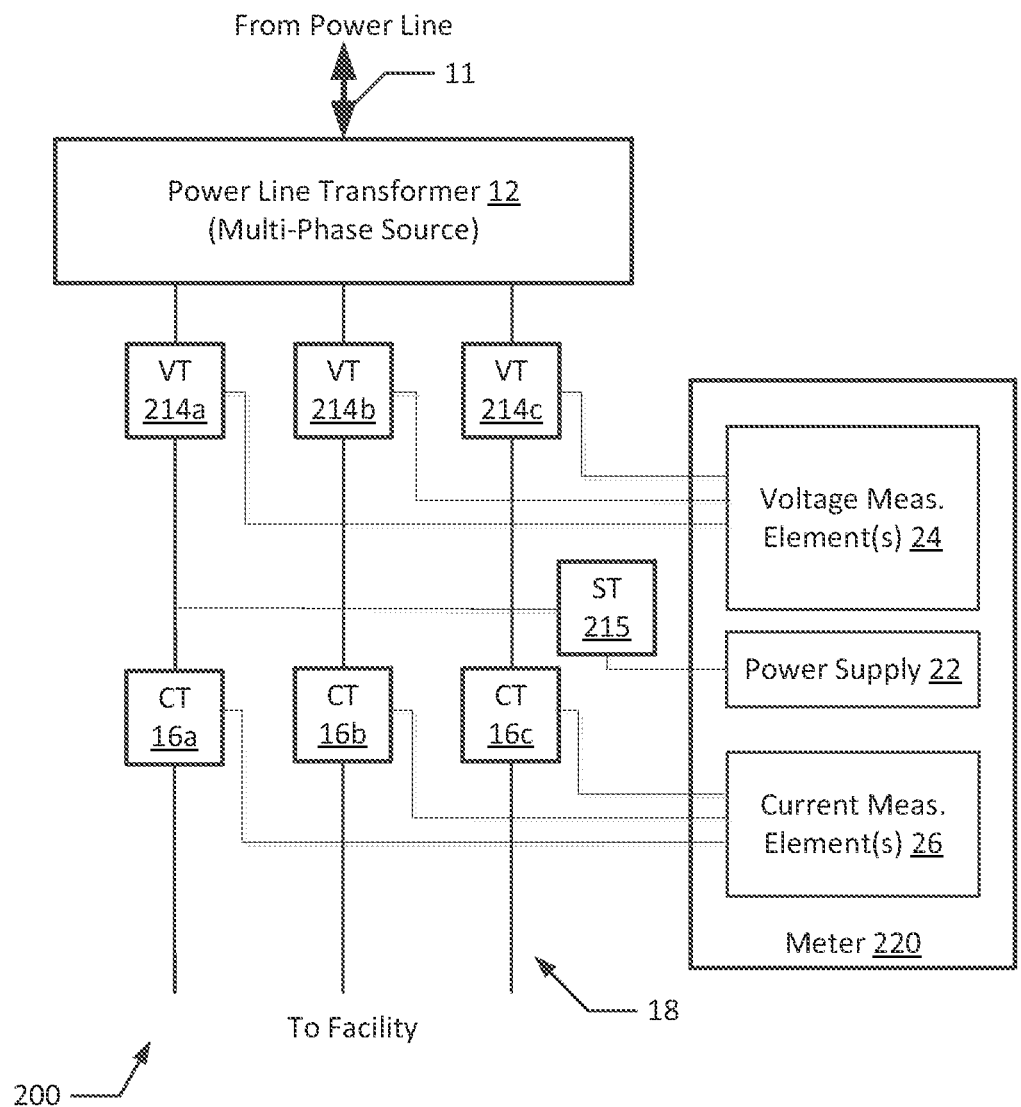
FIG. 3 illustrates a transformer-rated metering arrangement useable to improve protection and lower installation and maintenance costs associated with electrical meters, according to an example embodiment.

Referring to FIG. 3, a first example of a transformer-rated metering arrangement 200 implementing aspects of the present disclosure is illustrated. In this example arrangement 200, a meter 220 is electrically connected to a power line transformer 12 via voltage transformers 214a-c and current transformers 16a-c, each of which are connected to a different phase of the power line transformer 12, i.e., the electrical service to which a facility 18 is connected. In the example embodiment shown, rather than connecting power supply 22 to a phase (as in FIG. 1), a separate signal transformer 215 is included in the overall arrangement 200, such that the voltage transformer 214a does not directly connect to the power supply 22, but rather the signal transformer 215 connects to the A phase leading from the voltage transformer 214a.

The power supply 22 is in some embodiments a switching power supply that allows for operation at various voltage levels, as well as continued operation when the meter 220 is not receiving power via the electrical service 12. For example, the power supply 22 may switch to an alternative power source, such as a battery, solar inverter, or other supply source to allow continued operation of the meter. In other cases, the power supply simply requires receipt of a variety of different voltages, and operates as a non-linear load, which affects the electrical line to which it is connected.

Accordingly, and because the signal transformer 215 provides a separation or isolation of the power supply 22 from the voltage measurement elements 24, the signal provided to the voltage measurement elements 24 remains "stiff" even when used in connection with a voltage transformer having a lower burden rating. As such, voltage transformers 214a-c can be selected such that they are substantially smaller, more compact, and less expensive than voltage transformers 14a-c of FIG. 1. In example embodiments, voltage transformers 214a-c can be implemented using toroidal autotransformers, rather than larger isolation transformers typically used. Example embodiments of particular arrangements of transformer-rated meters and associated circuit arrangements are discussed below in connection with FIGS. 9-11.

Figure 2:
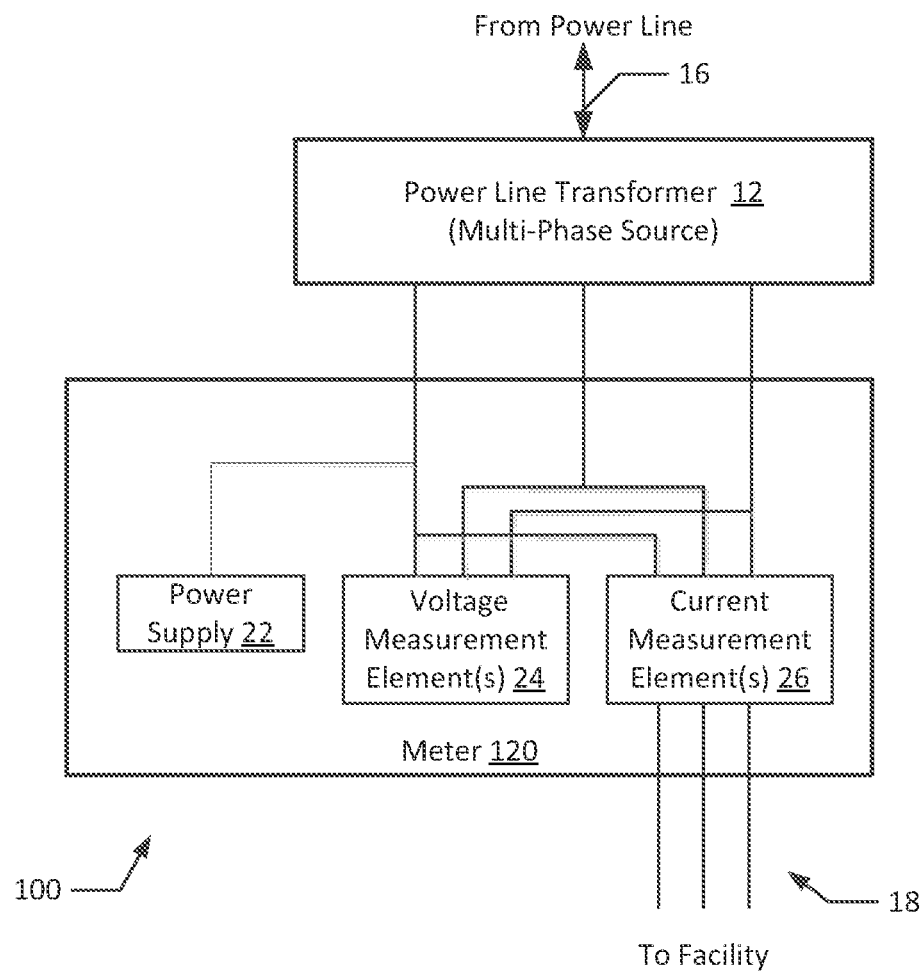
FIG. 2 illustrates an existing self-contained meter arrangement installable at a customer premises.
Figure 4:
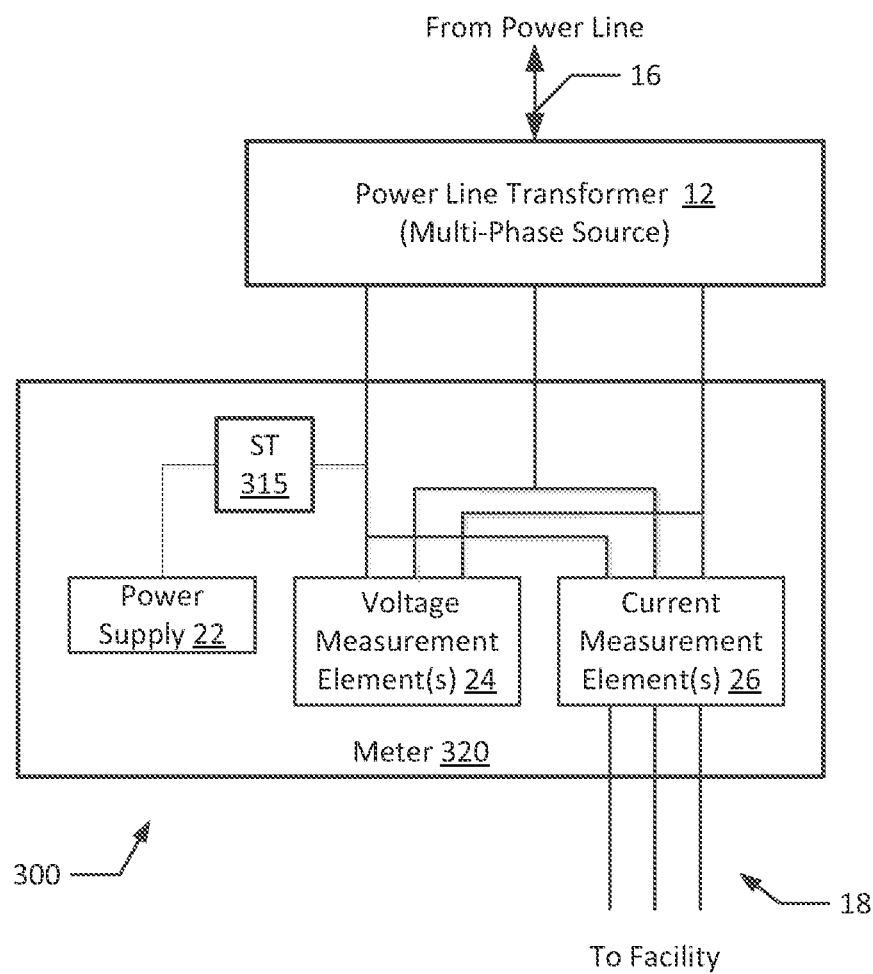
FIG. 4 illustrates a self-contained metering arrangement useable to improve protection and lower installation and maintenance costs associated with electrical meters, according to an example embodiment.

FIG. 4 illustrates a self-contained metering arrangement 300 useable to improve protection and lower maintenance costs and associated with electrical meters as well as improve reliability, according to an alternative embodiment to that shown in FIG. 3. Because in the arrangement of FIG. 4 a self-contained meter 320 is used, separate voltage transformers are not used externally to the meter 320. However, even in this arrangement, a separate signal transformer 315 is included. In this instance, the separate signal transformer 315 is integrated into the meter 320, and provides a dedicated transformer associated with the power supply 22. In this case, because a separate signal transformer 315 is incorporated into the meter 320 as compared to the arrangement of FIG. 2, the meter provides isolation of the power supply from the voltage measurement element(s). Example embodiments of particular arrangements of self-contained meters and associated circuit arrangements are discussed below in connection with FIGS. 6-8.

In comparison to the arrangement of FIG. 3, it is noted that in the self-contained meter arrangement 300 of FIG. 4, an entirely new meter is required, which incorporates a signal transformer 315 rather than simply including a separate transformer 215 useable in connection with an existing meter 220, as in FIG. 3. Furthermore, because in self-contained meters no separate electrical connection is typically used for the power supply 22 (since a power supply 22 is typically connected internally to one of the phases of an electrical service 12), in the example of FIG. 4, no separate electrical connection may be required, which, in the case of the transformer rated meter 320 of FIG. 3, requires either (1) reuse and re-mapping of existing electrical connections or (2) definition of a new electrical connection format for meters that incorporate such a separate, dedicated signal transformer. Examples of such reuse or remapping are discussed in further detail below.

Figure 5:
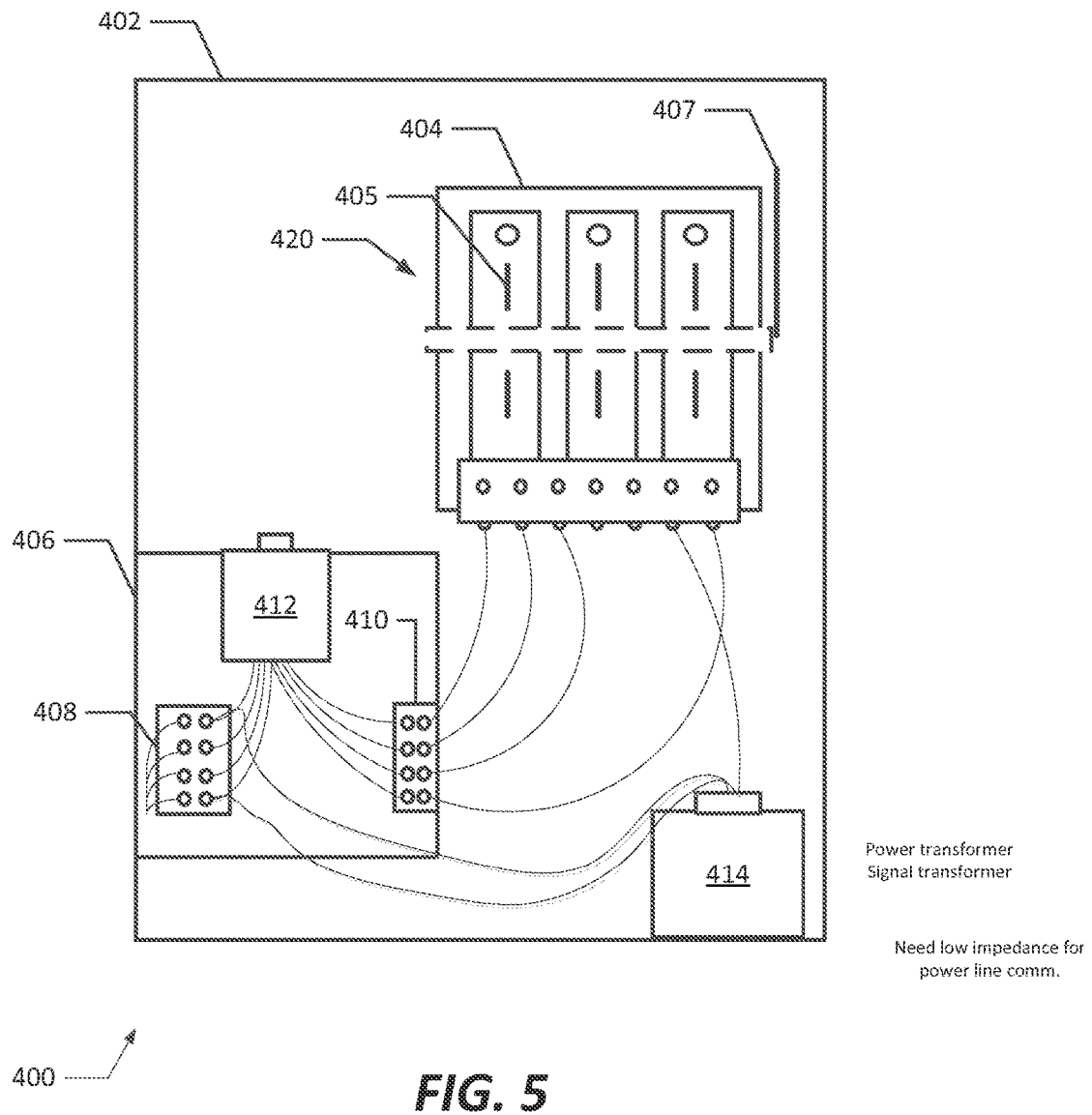
FIG. 5 is a schematic layout of an example metering enclosure including a self-contained metering arrangement used in connection with a self-contained meter, according to an example embodiment.

Referring to FIG. 5, an example schematic layout 400 of a metering enclosure 402 including a metering arrangement used in connection with a transformer-rated meter is disclosed. In the example shown, the metering enclosure 402 can be located at a premises of an electrical utility customer. The metering enclosure 402 includes a meter socket 404 and a transformer cabinet 406. In the embodiment shown, the meter socket 404 includes a plurality of electrical connections 405, or "stabs", which receive electrical connections of a meter. A lever arm 407 can be used to lock the meter in place, and optionally includes a failsafe electrical disconnection feature to short one or more current transformers that may be included in the overall layout 400 to prevent electrical sparking or unintended electrical connections, as is known in the art. Other mechanical socket arrangements are available as well.

A connection block 409 of the meter socket 404 receives electrical connections from the transformer cabinet 406, which contains connection blocks 408, 410, and a plurality of voltage transformers 412. In the embodiment shown, incoming electrical lines are connected to connection block 408, which connects to the voltage transformers 412. An output side of the voltage transformers 412 connects to the connection block 410, which in turn is electrically connected to the connection block 409 of the meter socket 404.

In the embodiment shown, a signal transformer 414 can be included in the metering enclosure 402, and electrically connects to a further electrical connection of the meter socket 404. The signal transformer 414, in the embodiment shown, is rated to have a low impedance to allow for signals delivered onto the power line, e.g., for power line communications, to not be blocked by the signal transformer, since the same line that typically connects to a power supply is used for low frequency power line communications. In alternative applications where power line communications are not desired, a higher impedance signal transformer can be used.

Figure 9:
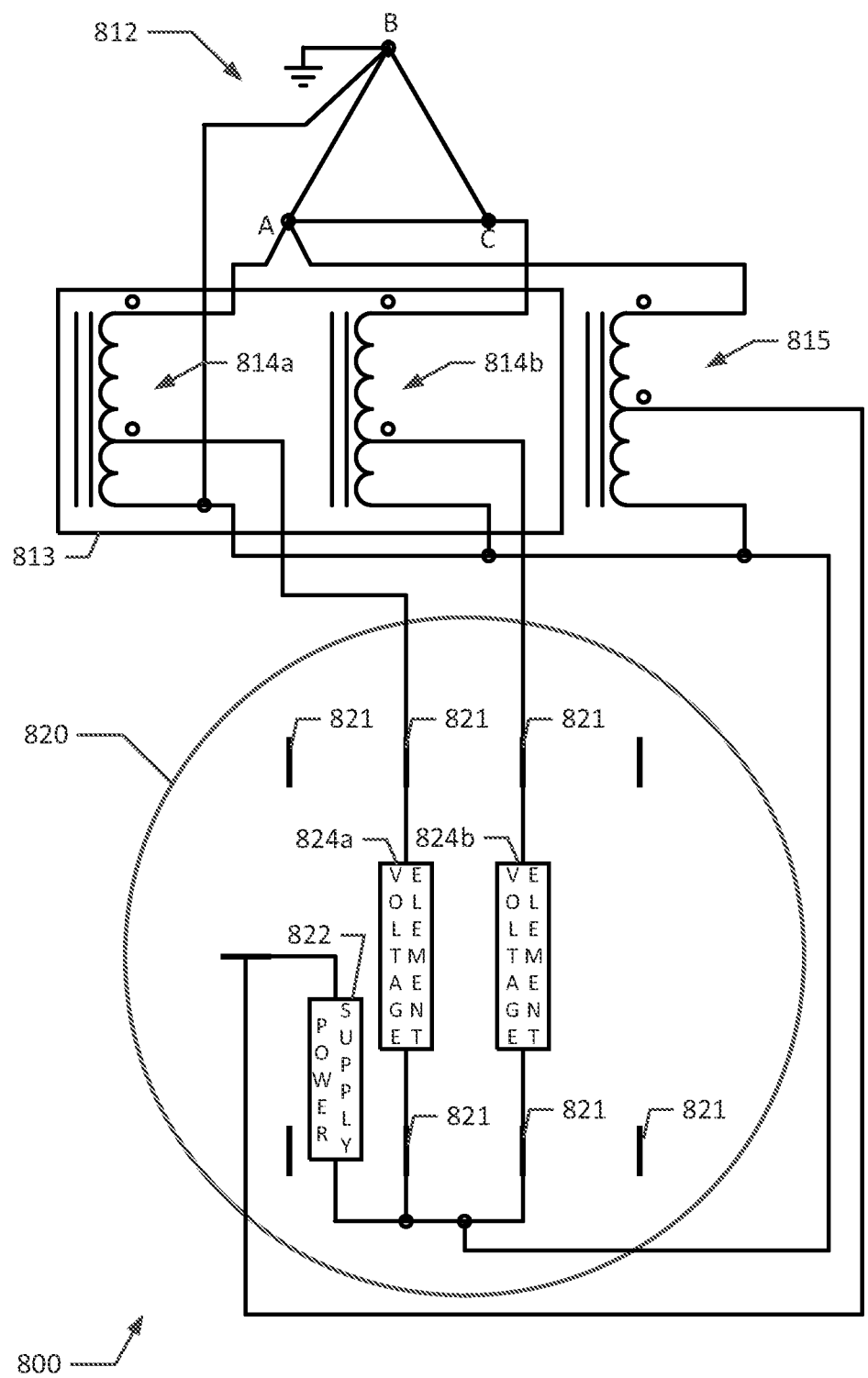
FIG. 9 is a schematic layout of an example metering circuit for a 600 or 480 Volt 3-wire delta service used in connection with a transformer-rated meter, according to an example embodiment of the present disclosure.
Figure 10:
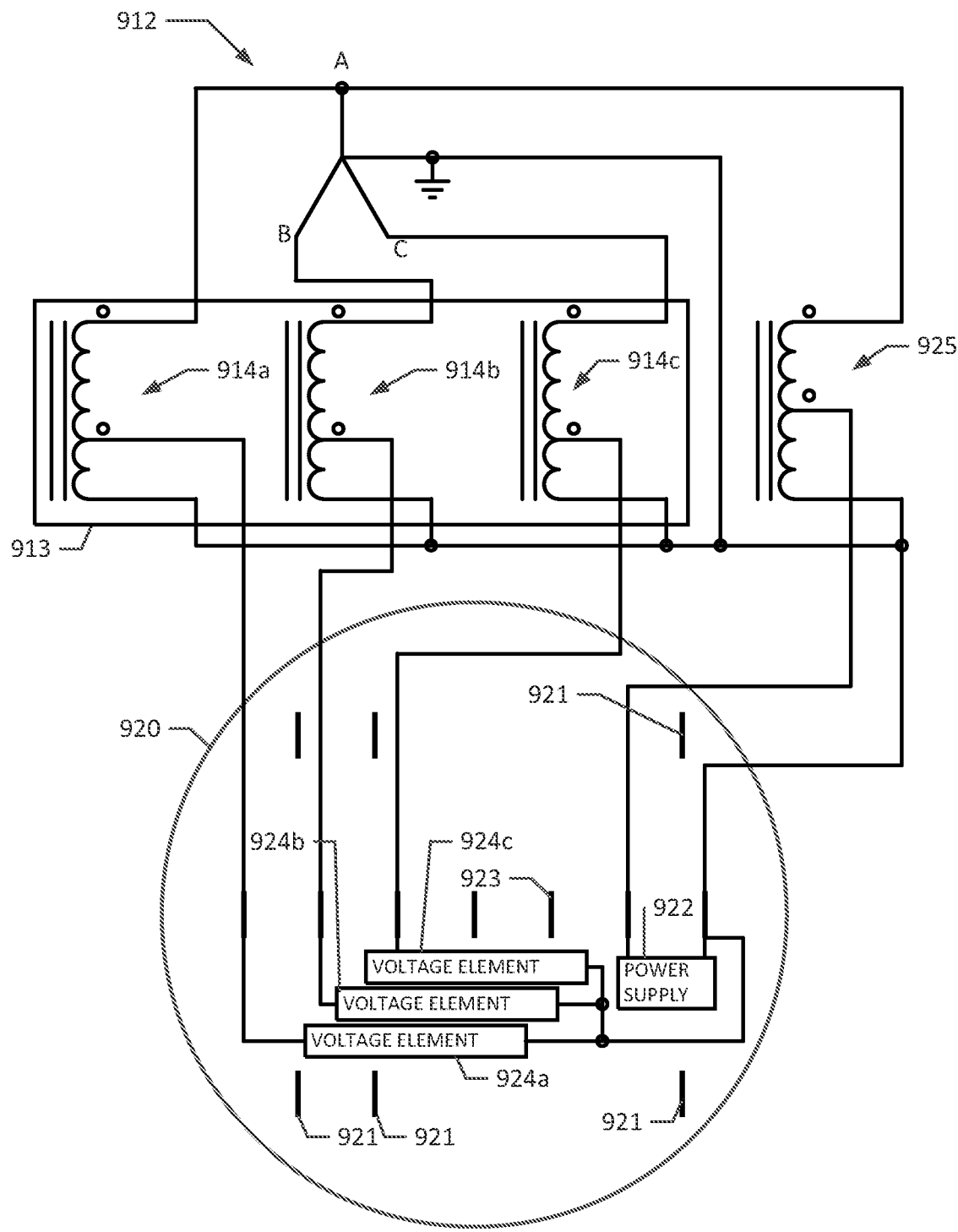
FIG. 10 is a schematic layout of an example metering circuit for a 600/347 or 480/277 Volt 4-wire wye service used in connection with a transformer-rated meter, according to an example embodiment of the present disclosure.
Figure 11:
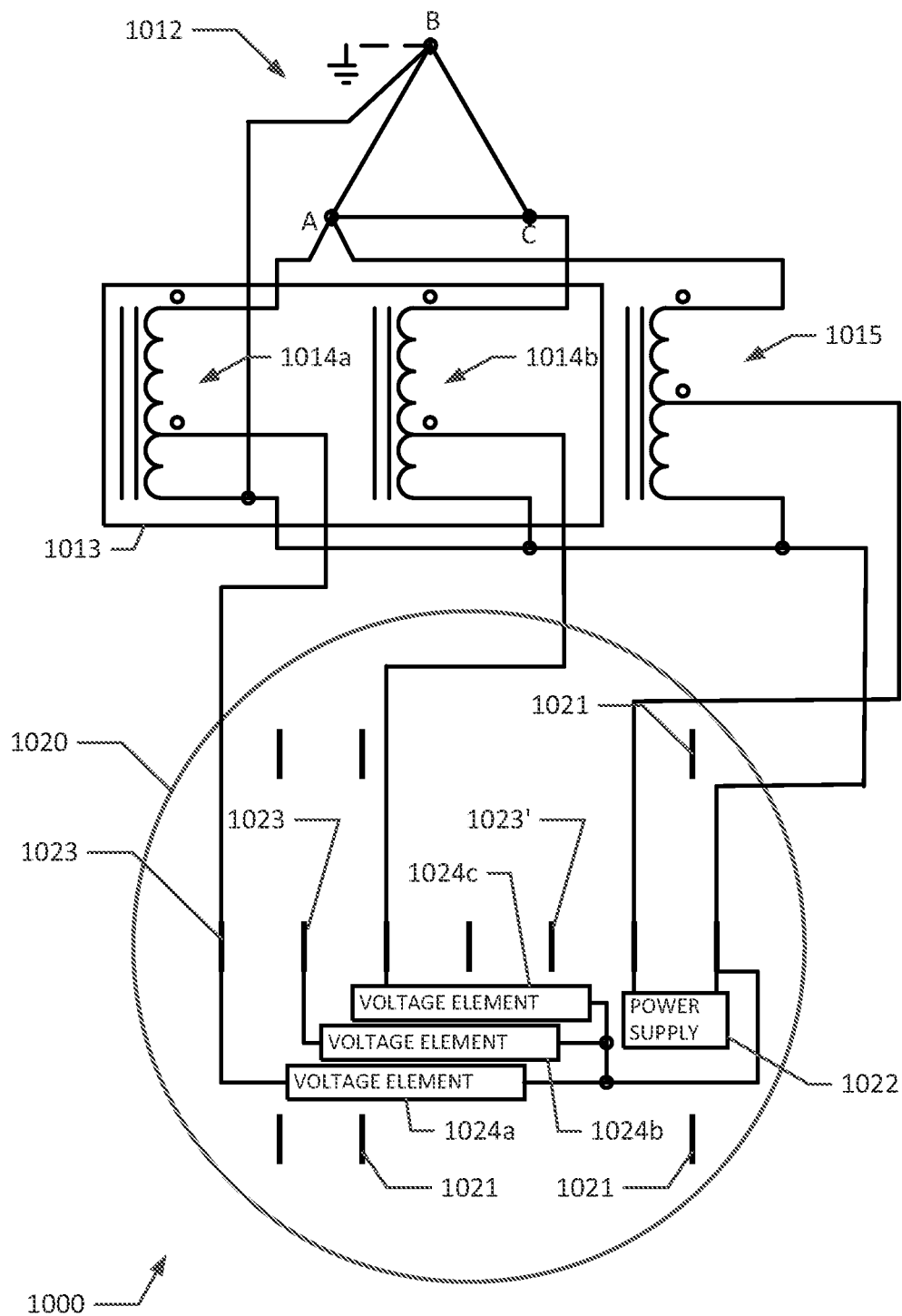
FIG. 11 is a schematic layout of an example metering circuit for a 600 or 480 Volt 3-wire delta service used in connection with a transformer-rated meter in connection with a remapping of electrical connections in a revised format meter socket, according to an example embodiment of the present disclosure.

It is understood that although in the layout 400 shown a single voltage transformer 412 is depicted, two or more such transformers will typically be used, depending on the service provided to a customer (e.g., the number of phases of the power line service, whether one of the phases is grounded, etc.) Example specific applications including various services, utilizing varying numbers of voltage transformers, are depicted in FIGS. 9-11.

Generally, the layout 400 as illustrated provides an example housing for an electrical meter and associated circuitry, such that surrounding circuitry can be conveniently added to or maintained by a technician at a customer premises. Specific examples of circuitry usable in connection with the layout 400 are discussed below in connection with FIGS. 6-11.

Referring now to FIGS. 6-11, various example embodiments are shown in which different types of electrical services are provided to a customer premises, and used with meters having different electrical connection formats. The electrical connection formats associated with the meters of FIGS. 6-11 reflect one or more ANSI standards, defining an expected electrical connection location and format of expected signal connections.

Figure 6:
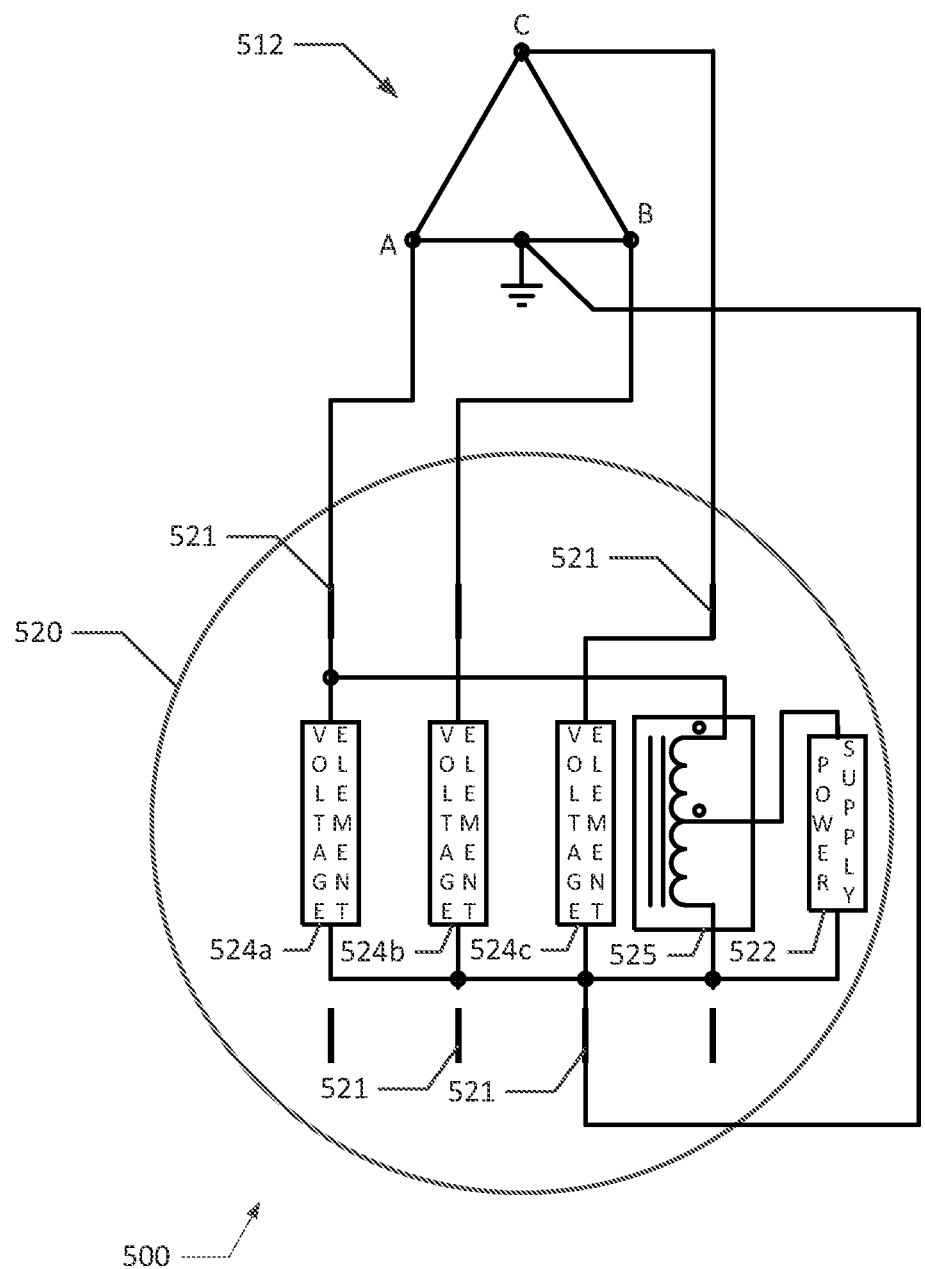
FIG. 6 is a schematic layout of an example metering circuit for a 480/240 V 4-wire delta service, according to an example embodiment of the present disclosure.
Figure 7:
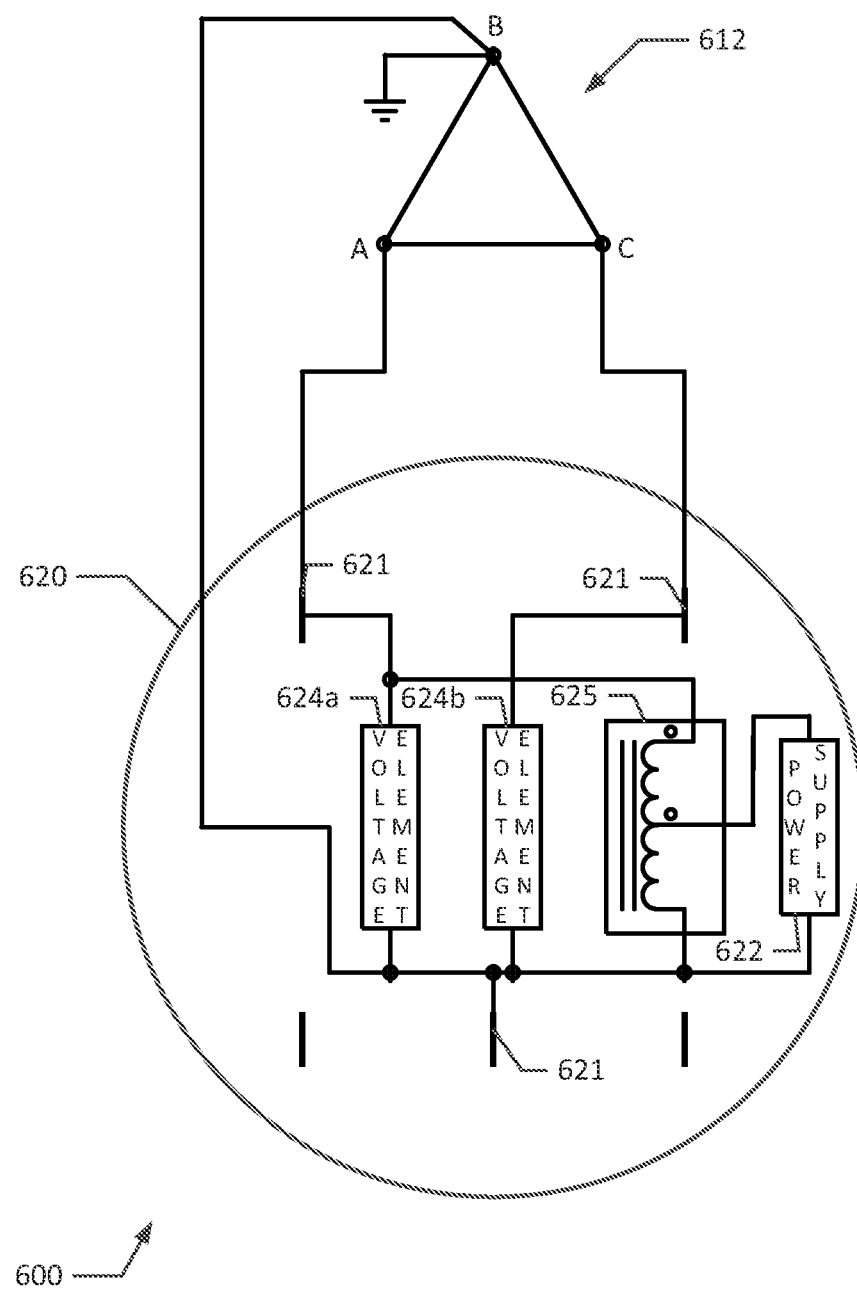
FIG. 7 is a schematic layout of an example metering circuit for a 600 or 480 Volt 3-wire delta service used in connection with a self-contained meter, according to an example embodiment of the present disclosure.
Figure 8:
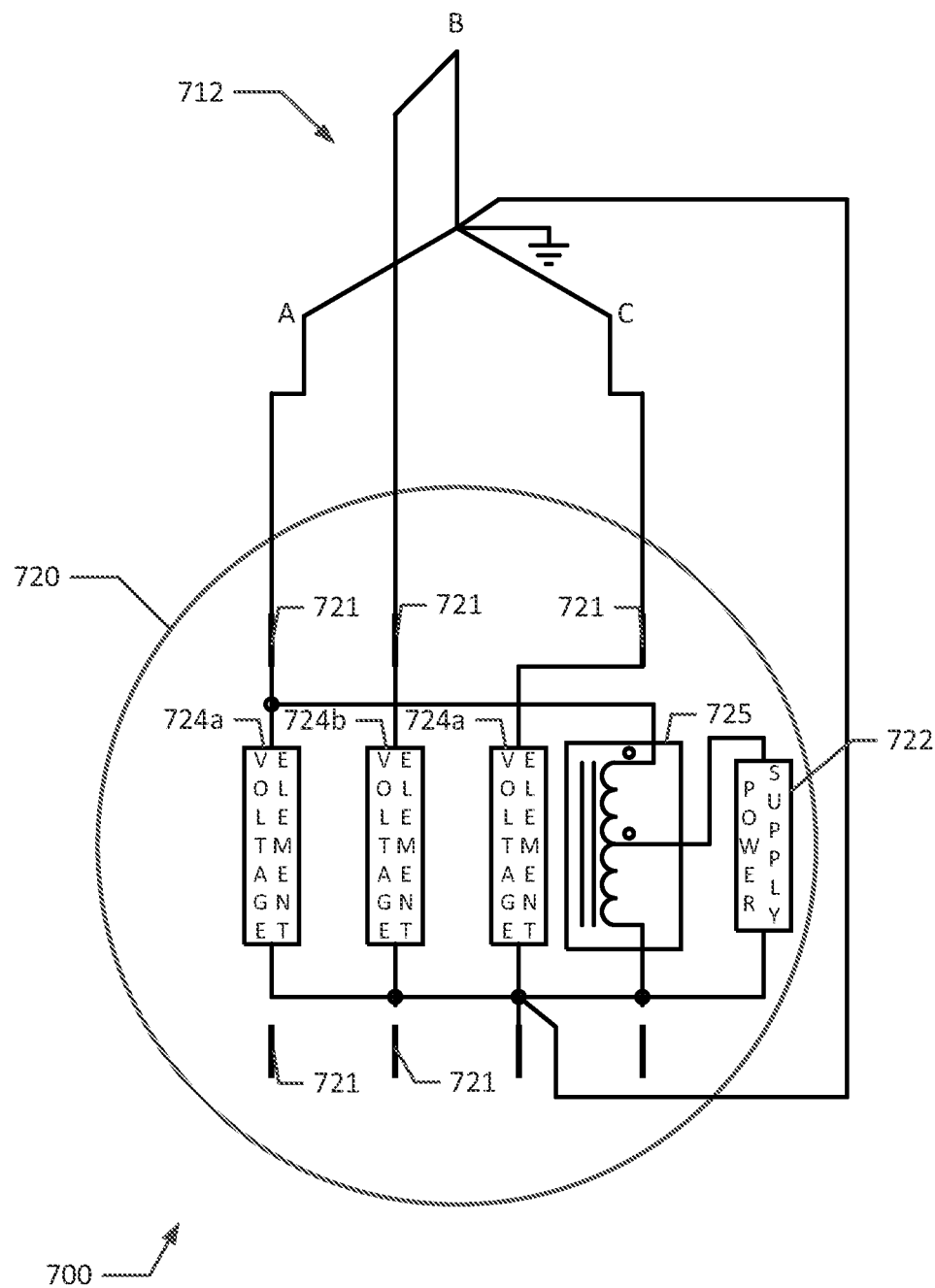
FIG. 8 is a schematic layout of an example metering circuit for a 600/347 or 480/277 Volt 4-wire wye service used in connection with a self-contained meter, according to an example embodiment of the present disclosure.

Referring now to FIGS. 6-8, example embodiments depicting a circuit and modified electrical meter are shown, in the context of using a self-contained meter. Generally, each of the circuits illustrated in FIGS. 6-8 are located at a premises of an electrical service customer, and represent different service installation types provided to typical customers. It is recognized that other service types are provided, and as such the various service types and circuits described herein are intended to be illustrative, rather than limiting on the scope of the present disclosure. Generally, such meters operate as discussed above in connection with FIG. 4, in which a signal transformer is integrated within a self-contained meter.

Referring now specifically to FIG. 6, a schematic layout of an example metering circuit 500 is shown for a 480/240 V 4-wire delta service, according to an example embodiment of the present disclosure. In the embodiment shown, the metering circuit 500 includes a meter 520 connected to an electrical service 512, shown as a four-wire delta service, provided by a power transformer.

In the embodiment shown, the meter 520 is a self-contained meter electrically configured to connect to a particular meter socket, specifically represented as a "form 16S" meter. The meter 520 includes electrical connections (shown as connections 521). In the embodiment shown, the meter includes a power supply 522 and a plurality of voltage measurement elements 524a-c. In this embodiment, three voltage measurement elements 524a-c are shown, corresponding to each phase of the four-wire delta service (with the fourth wire being a ground connection). As illustrated, each voltage measurement element 524a-c is electrically connected between one of the phases and the ground connection, with separate electrical connections 521 of the meter assigned to the various phases and the ground.

In the embodiment shown, the power supply 522 of the meter 520 is not connected directly in parallel with the "A-phase" of the meter (across the voltage measurement element 524a) but rather to a center tap and ground connection of a signal transformer 525 which is connected in parallel with the voltage measurement element 524a. In this arrangement, the signal transformer 525 can be a 2:1 ratio transformer, for example a 480:240 auxiliary power transformer. Such a transformer can be implemented using a toroidal autotransformer to ensure compactness and to minimize flux effects of that transformer on other circuit components.

It is noted that the current measurement element of the meter 520 associated with the A-phase will be on the service side of the signal transformer 525, to ensure that the subscriber need not pay for current consumed by the power supply 522 or transformer 525. Additionally, although not shown, it is recognized that the power supply 522 can be used for various applications within the meter 520. For example, the power supply 522 can provide power to an automatic meter reading (AMR) or advanced metering infrastructure (AMI) subsystem, useable in smart meters. Alternatively, the AMR/AMI system could be powered by some other separate electrical connection, as mentioned above, such that the signal transformer 525 could be eliminated, while maintaining electrical isolation of the power supply. It is further noted that in either case, a separate electrical connection to the power line may be provided to enable power line communications (not shown).

Referring to FIG. 7, a further example embodiment of a metering circuit 600 and associated self-contained meter 620 is illustrated. In this example, the metering circuit 600 includes the meter 620 connected to an electrical service 612, shown as a 600 or 480 V three-wire delta service, provided by a power transformer. Optionally, one of the phases of the electrical service 612, in this case shown as the B phase, is electrically grounded, such that the B phase represents a ground phase, and the A and C phases represent voltages to measure relative to the B phase.

In the embodiment shown, the meter 620 is electrically connected, at connections 621, to the A and C phases to voltage measurement elements 624a-b, respectively, and a return connection 621 is electrically connected to the B phase of the electrical service 612. In the example embodiment shown, the return connection 621 is connected to a separate electrical connection 621' that is rotated 90 degrees from the connections 621. Accordingly, in this arrangement, a utility can opt to electrically connect the B phase to either the electrical connection 621' or to a different electrical connection 621 (at the lower central location as shown). Accordingly, the meter 620 can be used in circumstances where one would use a form 12S meter, since the connections are compatible with those of a Form 12S meter. However, it is recognized that, a Form 12S meter may connect to one of connection 621 (at the bottom center position) and connection 621'.

As with the meter 520 of FIG. 6, in the embodiment shown, a signal transformer 625 is electrically connected in parallel with the voltage measurement element 624a within the meter, between the A phase and B phase connection. In the embodiment shown, the signal transformer 625 is a 2:1 (e.g., 480:240 V or 600:300 V) toroidal autotransformer, including a lead that connects to an opposite side of a power supply 622 from the B phase connection.

Referring to FIG. 8, a still further example embodiment of a metering circuit 700 is shown, including a self-contained meter 720. In this embodiment, the self-contained meter 720 connects to an electrical service 712, shown as a 600/347 or 480/277 Volt 4-wire wye service used in connection with a self-contained meter.

As with FIGS. 6-7, in FIG. 8 three voltage measurement elements 724a-c are included within the meter, and a signal transformer 725 is electrically connected across the A phase voltage measurement element 724a. The signal transformer 725 electrically isolates a power supply 722, which can be used to power an AMR/AMI system or other meter reading or communications systems. As with FIGS. 6-7, the signal transformer as shown is a 2:1 ratio toroidal autotransformer, in this case rated to 600:300 V, or 480:240 V, depending on the service provided to the customer premises.

The meter 720 of FIG. 8 represents a modified form 16S meter connection arrangement, in that it uses existing electrical connections 721, but with a different connection arrangement than is expected in a typical 16S meter configuration.

Although in FIGS. 6-8 the meters 520, 620, 720 are shown as being associated with a 480 V or 600 V service (in the case of 3-wire delta service) or 600/347 or 480/277 V services (in the case of a 3- or 4-wire wye service), other voltages could be used as well, such as a 830/480 V service. Still further, other meter socket types could be used, such as forms 1, 2, 12, 13, 16, or 25 format meter interfaces. Additionally, it is noted that the signal transformer 525, 625, 725 of FIGS. 6-8 can be of various ratings. For example, if the meters 520, 620, 720 respectively use power supplies 522, 622, 722 for powering a power line communications device for purposes of automatic meter reading, the signal transformer may need to be a larger transformer providing low impedance to allow for such communications to take place.

Referring to FIGS. 6-8 generally, although in typical applications a self-contained meter will include a system of MOV arrestors used to protect the power supply of the self-contained meter, inclusion of a signal transformer 525, 625, 725 in the meters 520, 620, 720, respectively, allows for reliable operation in the event of sustained overvoltage, which would otherwise ultimately cause the MOV arrestors to fail. Furthermore, to reliably operate and protect under possible conditions of sustained overvoltage, in some embodiments the signal transformer 525, 625, 725 can have a primary voltage withstand capability of 480×1.73=830 volts. In such cases, the power supply 522, 622, 722 can be configured to operate at voltages from about 30-300 volts. Because some of the known causes of destructive transients and overvoltage conditions that cause meter power supplies to fail are lightning, utility line switching, ferro-resonance and ungrounded wye/delta phenomena, such destructive conditions can be avoided by adding the signal transformer to the MOV arresters currently included in such meters.

Referring now to FIGS. 9-11 additional arrangements are shown in which signal transformers are included external to an electrical meter alongside voltage transformers that would typically be provided for purposes of a transformer-rated meter. Generally, such meters operate as discussed above in connection with FIG. 3, in which a signal transformer is electrically connected to a phase of the power delivered to the customer premises.

FIG. 9 is a schematic layout of an example metering circuit 800 for an electrical service 812 that is shown as a 600 or 480 Volt service used in connection with a transformer-rated meter, according to an example embodiment of the present disclosure. In this metering circuit 800, the electrical service 812 has three phases, with A phase and C phase being ungrounded and B phase being optionally grounded. Each of the A and C phases are electrically connected to a meter 820 via voltage transformers 814a-b. The voltage transformers 814a-b are connected at a ground side to the B phase of the power supply 812. In the embodiment shown, the voltage transformers are 4:1 or 5:1 transformers, optionally implemented as toroidal autotransformers, and include a wire tap that electrically connects to voltage measurement elements 824a-b, through the two "top center" electrical connections 821 as shown. The grounded B phase is electrically connected to common electrical connections below those to which the A and C phases connect.

In the embodiment shown, a signal transformer 825 is included external to the meter 820, and is electrically connected across the A phase and B phase. The signal transformer, optionally a 2:1 (e.g., 600:300 V or 480:240 V) toroidal autotransformer, is electrically connected to a new electrical connection 821', which is an extra connection at a midpoint of the meter and rotated 90 degrees as compared to the orientation of the other connections. The new electrical connection 821' connects to one side of a power supply 822 within the meter, with the opposite side being connected to the grounded B phase to establish a voltage difference at the power supply (e.g., for powering AMR/AMI or other devices internally to the meter 820).

In this embodiment, the meter utilizes a modified version of the form 35S or 45S meter connection arrangement. This alternative arrangement, representing a proposed form 55S arrangement, adds the new electrical connection 821' since in traditional form 35S or 45S meters each of electrical connections 821 are used for voltage transformer connections (as shown) or current transformer connections (excluded for purposes of clarity).

It is noted that, because of the separation of the power supply by signal transformer 825, the voltage transformers 814a-b of this embodiment can be substantially smaller than in a traditional arrangement. This is because although they must remain accurate, they do not require the same thermal burden rating or to provide the same signal stiffness as would be required if connected to the power supply 825. Accordingly, and as noted above, very small toroidal autotransformers could be used in the metering circuit 800.

As noted above, prior art voltage transformers would, at their smallest, be sizable and weigh in excess of about 15 pounds. In the embodiment shown, a small, integrated transformer package, e.g., package 813, could be utilized, which weighs in some cases less than one to two pounds, and could be approximately 4-5 inches long, 3-4 inches tall, and 3-4 inches wide. Because of the reduced burden of removing/isolating the power supply 825, such transformers 814a-b can be within a small percentage (<0.1%, and typically <0.05%) of accuracy, which represents a significant improvement over existing voltage transformer accuracy standards. Additionally, such smaller transformers and associated packaging represents substantial cost reductions relative to existing transformer installations, which encourages adoption of transformer installations at electrical meter locations, thereby enhancing safety for meter service technicians, and improving reliability.

In some alternative embodiments, a modular system could be used to selectively or individually add voltage transformers or one or more signal transformers to a metering circuit, consistent with the present disclosure. Such an arrangement is discussed in further detail in connection with U.S. Provisional Patent Application No. 61/976,387, entitled "Modular Transformer System", and filed on Apr. 7, 2014 the disclosure of which is hereby incorporated by reference in its entirety.

FIG. 10 is a schematic layout of an example metering circuit 900 for an electrical service 912, illustrated as a 600/347 or 480/277 Volt 4-wire wye service used in connection with a transformer-rated meter, according to an example embodiment of the present disclosure. In the embodiment shown, the metering circuit 900 connects the electrical service 912 to an electrical meter 920 via voltage transformers 914*a-c* and a signal transformer 925.

In the embodiment shown, the voltage transformers 914*a-c* can be implemented in a package 913 using 2.5:1 or 3:1 toroidal autotransformers, while the signal transformer can be implemented using a 2:1 transformer in a separate package or enclosure as discussed above in connection with FIG. 9. Furthermore, analogously to the voltage transformers and signal transformer described in FIG. 9, the transformers 914*a-c* can be implemented using a collective housing 915, or in a modular system alongside the signal transformer 925 as discussed above and in U.S. Provisional Patent Application No. 61/976,387, entitled "Modular Transformer System", and filed on Apr. 7, 2014, the disclosure of which was previously incorporated by reference.

In the embodiments discussed herein, the voltage transformers can be selected such that they are substantially smaller and have a low VA burden rating than in existing designs. While voltage transformers generally will have a rating of about 300-500 VA, the transformers 914*a-c* of the present disclosure (as well as transformers 814*a-b* of FIG. 9) can have a rating of about 10-15 VA. The signal transformer 925 can be equivalently small and lower-cost, with a rating below about 15 VA. Of course, other ratings may be used as well for the signal transformer 925, for other reasons (e.g., a 500-750 VA rated signal transformer for use in connection with some AMI systems, such as TWACS from Aclara of Hazelwood, Mo., or other low impedance or higher rated transformers to accommodate power line communications).

In the embodiment shown, the electrical meter 920 represents a Form 19S meter, or alternatively uses a modified Form 9S meter which eliminates one communication connection 923', generally referred to as the "Y" connection of the KYZ jaws of a form 9S socket designed to receive such a meter. Generally, such formats use thirteen terminals, with six terminals (shown as connections 621) used for current, and seven other terminals (shown as connections 623) used for voltage and communications. In such embodiments, the eliminated communication connection 923' can be plugged, thereby preventing meters having the traditional Form 9S format from being applied in metering applications including this modification, since it would cause meter mis-reads or malfunction due to the different electrical connections internal to the meter.

It is noted that, in the embodiment shown, although the meter 920 is transformer rated, it is often installed without using voltage transformers, to save substantial installation costs. However, such installations have a safety and reliability disadvantage, in that fault currents that may occur in a socket connect directly from the power transformer 912. Malfunctions and unintended grounding currents can cause catastrophic burns to technicians and equipment. As such, in the embodiment shown, using small and cost-effective voltage transformers 914*a-c*, and an associated signal transformer 925, such safety issues can be addressed without resorting to using safety clothing/equipment for each technician, which itself can be burdensome, time consuming to put on or take off, and costly.

Referring now to FIG. 11, a schematic layout of an example metering circuit 1000 for an electrical service 1012, shown as a 600 or 480 Volt 3-wire delta service is shown. The metering circuit 1000 can be used in connection with a transformer-rated meter in association with a remapping of electrical connections in a revised format meter socket, according to an example embodiment of the present disclosure. In the embodiment shown, the metering circuit 1000 connects an electrical service 1012 to a meter 1020 via voltage transformers 1014*a-b* and a signal transformer 1025, which generally correspond to those transformers 814*a-b*, 825 described above in connection with FIG. 9. In particular, the voltage transformers 1014*a-b* can be packaged in an enclosure 1013, or in a modular system as discussed above, alongside a separate signal transformer 1025. However, in this embodiment, the voltage measurement elements 1024*a-c* and the power supply 1022 are electrically connected to connections 1023 analogously to the arrangement in FIG. 10, using the "modified" electrical connection format of FIG. 10, including current connections 1021 and voltage connections 1023, including eliminated voltage connection 1023'.

Because there are only two ungrounded phases (A phase and C phase), voltage measurement element 1024*b* is disconnected, and the meter only measures voltage based on the voltage measurement elements 1024*a*, 1024*c*. Normally, this would cause the meter 1020 to not recognize the service during meter diagnostics, thereby preventing proper meter operation. Furthermore, because the B phase may not be grounded in this arrangement, the meter cannot assume that the B phase is a ground connection, which may be the case in a standard meter form. However, in this case, a meter 1020 could be used that is capable of remapping electrical connections and would accommodate this different service connection. An example of such a meter would be a meter that includes a Fitzall application provided by GE Digital Energy of Atlanta, Ga. or as supplied by the 1130 Prog feature from Landis+Gyr of Zug, Switzerland.

Further referring to FIGS. 9-11, it is noted that although some example formats of electrical meters are discussed, others may be possible as well. In example embodiments, electrical meters having various formats could incorporate an isolated power supply, for example as isolated via a separate signal transformer. Example formats include a form 3 format, a form 4 format, a form 35 format, a form 45 format, a form 55 format, a form 9 format, a form 10 format, a form 39 format, a form 26 format, a form 29 format, a form 46 format, a form 56 format, a form 66 format, and a form 76 format.

Although in the various embodiments shown above, it is assumed that the voltage transformers and signal transformers are maintained in a separate cabinet or enclosure (e.g., as shown in FIG. 5), such transformers can also be incorporated into a meter socket due to the reduced size. Other locations may be used as well, depending on convenience for maintenance, wiring isolation issues, or other factors.

Furthermore, and as noted above, although the isolation of the power supply is generally discussed herein as being performed using a signal transformer, that transformer can alternatively be referred to as an auxiliary power transformer. In still further embodiments, the isolation of the power supply can be accomplished by providing a different isolated power connection to that power supply that is not drawn from one of the phases of the power service (e.g., a service outlet or other power source).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. An electrical circuit protecting an electrical utility meter used in connection with an electrical supply connection having a plurality of phases, the protection circuit comprising:
   a plurality of voltage transformers, each of the plurality of voltage transformers including a power line side connection electrically connected to one of the plurality of phases of the electrical supply connection and a meter-side connection electrically connected to an input power connection of an electrical meter; and
   a signal transformer electrically connected between one of the plurality of phases of the electrical supply connection and a separate electrical connection of the electrical meter dedicated to a power supply of the electrical meter, the signal transformer comprising a toroidal autotransformer.

2. The electrical circuit of claim 1, wherein the electrical connection includes a signal transformer electrically connected between one of the plurality of phases of the electrical supply connection.

3. The electrical circuit of claim 2, further comprising an electrical meter having a predetermined socket type, the electrical meter including a mapping application reassigning electrical connections based on an electrical service type to which the electrical meter is connected.

4. The electrical circuit of claim 2, wherein the signal transformer has a rating of less than about 20 volt-amperes.

5. The electrical circuit of claim 2, wherein each of the plurality of voltage transformers has a thermal burden of less than about 20 volt-amperes.

6. The electrical circuit of claim 2, wherein at least the plurality of voltage transformers are positioned within a housing mounted in proximity to the electrical meter.

7. The electrical circuit of claim 2, wherein the housing and the plurality of voltage transformers weighs less than approximately two pounds.

8. The electrical circuit of claim 2, wherein each of the plurality of voltage transformers is dedicated to connection between one of the plurality of phases of the electrical supply connection and a voltage measurement element of the electrical meter.

9. The electrical meter of claim 1, wherein the electrical connection comprises a service outlet connection from an electrical service.

10. An electrical meter arrangement installed at a location associated with an electrical service customer, the arrangement comprising:
    an electrical meter monitoring power consumption of the electrical service customer, the electrical meter including a plurality of input power connections and having a plurality of voltage measurement elements configured to measure a voltage at a plurality of different phases of an electrical service;
    a plurality of voltage transformers, each of the plurality of voltage transformers including a power line side connection electrically connected to one of the plurality of phases of the electrical supply connection and a meter-side connection electrically connected to a corresponding voltage measurement element;
    an electrical connection of the electrical meter dedicated to a power supply of the electrical meter; and
    a signal transformer electrically connected between one of the plurality of phases of the electrical supply connection and the electrical connection of the electrical meter dedicated to the power supply of the electrical meter, the signal transformer comprising a toroidal autotransformer.

11. The electrical meter arrangement of claim 10, wherein the electrical meter has a format modified to include a dedicated electrical connection between the signal transformer positioned external to the electrical meter and the power supply of the electrical meter.

12. The electrical meter arrangement of claim 10, wherein the signal transformer has a 2:1 winding ratio.

13. The electric meter arrangement of claim 10, wherein the electric meter comprises a transformer-rated electrical meter.

14. The electrical meter arrangement of claim 10, wherein the plurality of voltage transformers and the signal transformer are positioned external to a housing of the electrical meter.

15. The electrical meter arrangement of claim 10, wherein the electrical service is selected from among a group of electrical service types consisting of:
    a four-wire delta service;
    a four-wire wye service;
    a three-wire wye service; and
    a three-wire delta service.

16. The electrical meter arrangement of claim 10, wherein the electrical meter has a format selected from among a group of formats consisting of:
    a form 3 format;
    a form 4 format;
    a form 35 format;
    a form 45 format;
    a form 55 format;
    a form 9 format;
    a form 10 format;
    a form 39 format;
    a form 26 format;
    a form 29 format;
    a form 46 format;
    a form 56 format;
    a form 66 format; and
    a form 76 format.

17. The electrical meter arrangement of claim 10, wherein the plurality of voltage transformers weighs less than about two pounds.

18. A method of managing electrical connections to an electrical meter associated with delivery of an electrical service to a customer premises by a user, the method comprising:
    electrically connecting a different voltage transformer of a plurality of voltage transformers to each of a plurality of phases of the electrical service;
    electrically connecting each of the plurality of voltage transformers to a voltage measurement element of an electrical meter;
    electrically connecting a signal transformer to one of the plurality of phases of the electrical service; and
    electrically connecting the signal transformer to a power supply of the electrical meter in the absence of connecting the signal transformer between a voltage transformer of the plurality of voltage transformers and the corresponding voltage measurement element;

wherein the signal transformer is electrically connected between one of the plurality of phases of the electrical service and a connection of the electrical meter associated with the corresponding voltage measurement element, the signal transformer comprising a toroidal autotransformer.

19. The method of claim 18, wherein the user comprises a service person associated with the electrical service.

20. The method of claim 19, wherein, upon electrically connecting the plurality of voltage transformers and the signal transformer, the service person does not require protective gear to perform maintenance on the electrical meter.

21. The method of claim 18, wherein electrically connecting the different voltage transformer of a plurality of voltage transformers to each of the plurality of phases of the electrical service comprises mounting a housing for the plurality of voltage transformers in proximity to the electrical meter.

\* \* \* \* \*